United States Patent [19]

Savage, Jr.

[11] Patent Number: 5,426,265
[45] Date of Patent: Jun. 20, 1995

[54] CIRCUIT COMPONENT STAND-OFF MOUNT

[76] Inventor: John M. Savage, Jr., 538-B Via De La Valle, Solana Beach, Calif. 92075

[21] Appl. No.: 23,374
[22] Filed: Feb. 26, 1993
[51] Int. Cl.⁶ .......................................... H01B 17/00
[52] U.S. Cl. .................. 174/138 G; 361/809; 439/379
[58] Field of Search .................. 174/138 G, 52.1, 52.5; 361/807, 809, 825; 439/56, 893, 374, 379, 571

[56] References Cited

U.S. PATENT DOCUMENTS

| | | | |
|---|---|---|---|
| D. 200,157 | 1/1965 | Vincent | 174/138 G X |
| 2,999,895 | 9/1961 | Smith | 174/138 G |
| 3,184,536 | 5/1965 | Vincent | 174/138 G |
| 3,887,803 | 6/1975 | Savage, Jr. | 174/138 G X |
| 4,035,681 | 7/1977 | Savage, Jr. | 313/110 |
| 4,157,207 | 6/1979 | Robinson | 439/853 X |
| 4,195,330 | 3/1980 | Savage, Jr. | 362/226 |
| 4,219,172 | 8/1980 | Murayama | 174/138 G X |
| 4,398,240 | 8/1983 | Savage, Jr. | 362/311 |
| 4,402,110 | 9/1983 | Savage, Jr. | 16/225 |
| 4,471,414 | 9/1984 | Savage, Jr. | 362/226 |
| 4,491,900 | 1/1985 | Savage, Jr. | 362/230 |
| 4,727,648 | 3/1988 | Savage, Jr. | 29/839 |
| 4,821,152 | 4/1989 | Lorenzen | 174/138 G X |
| 4,837,927 | 6/1989 | Savage, Jr. | 29/839 |
| 4,986,772 | 1/1991 | Fukutani | 174/138 G X |
| 5,068,771 | 11/1991 | Savage, Jr. | 362/255 |
| 5,071,375 | 12/1991 | Savage, Jr. | 439/853 |

FOREIGN PATENT DOCUMENTS 2081516 2/1982 United Kingdom .......... 174/138 G

Primary Examiner—Michael W. Phillips
Assistant Examiner—Hyung S. Sough
Attorney, Agent, or Firm—William W. Haefliger

[57] ABSTRACT

A stand-off device to mount an electrical component, in stand-off relation to a horizontally extending circuit board, the component having elongated lead structure, comprising a longitudinally vertically elongated body having a supporting end portion to support the component remotely from the board, the body having slot structure extending from the end portion to receive the lead structure; and deflectable retention structure carried by the body in proximity to the slot structure to be engaged and deflected by the lead structure, whereby the retention structure frictionally retains the lead structure in position in the slot structure prior to attachment of the lead structure to the circuit board.

17 Claims, 3 Drawing Sheets

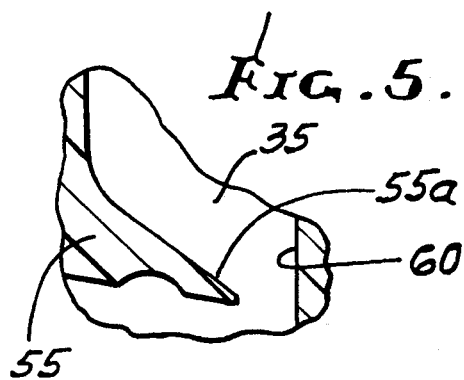
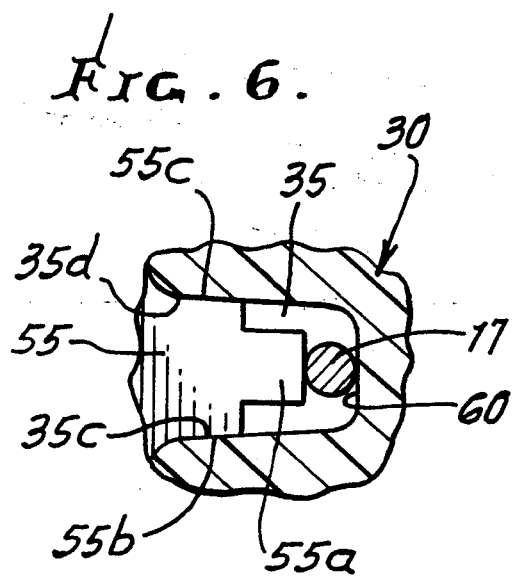
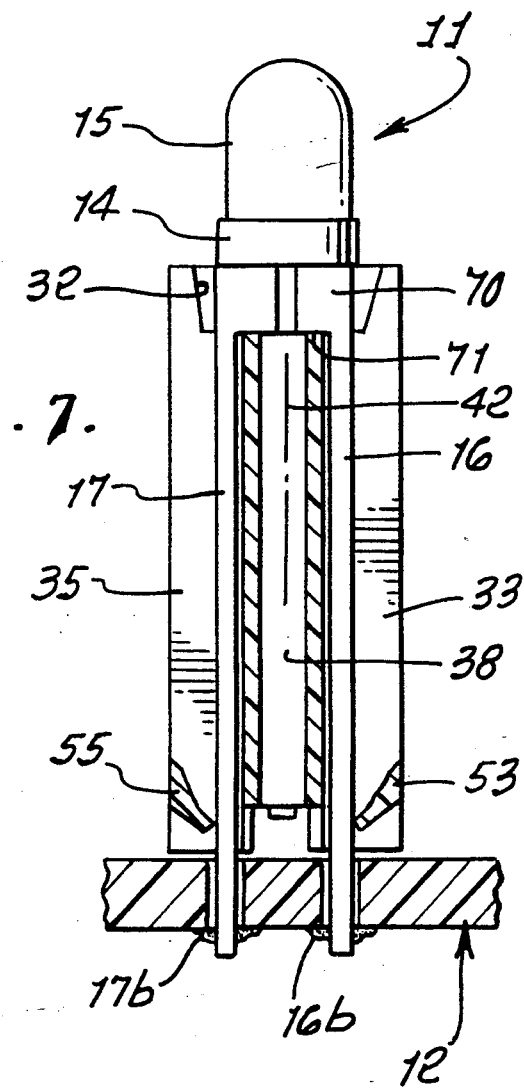

CIRCUIT COMPONENT STAND-OFF MOUNT

BACKGROUND OF THE INVENTION

This invention relates generally to stand-off devices for mounting electrical components, and more particularly to such devices which securely mount LEDs in stand-off relation to circuit boards.

There is great need for simple, effective, economical, and reliable apparatus to securely mount electrical components, such as LEDs on or to circuit boards. There is also need for devices of this nature which are capable of mounting LEDs or other components having different numbers of leads projecting toward the circuit board for electrical connection to circuitry on the board, and in the simple, effective manner as is now afforded by the present invention.

SUMMARY OF THE INVENTION

Basically the device of the invention comprises:

a) a longitudinally vertically elongated body having a supporting end portion to support the component remotely from the board, the body having slot means extending from the end portion to receive the lead means, b) and deflectable retention means carried by the body in proximity to the slot means to be engaged and deflected by the lead means, whereby the retention means frictionally retains the lead means in position in the slot means prior to attachment of the lead means to the circuit board.

As will appear, the slot means typically comprises at least two slots extending lengthwise of the body; and examples are two, three and four such slots which extend in parallel relation. Further, the body advantageously may have a central elongated slot passage at the axis of the body which extends parallel to the slots. The slots are typically in the form of channels opening away from the body longitudinal axis.

Another object of the invention is to provide the retention means in the form of resiliently deflectable tab means. The tab means typically comprises tabs projecting toward the axis and into paths of reception of the lead means in the form of multiple leads when the leads are received into the slots for interference engagement with the leads tending to deflect the tabs. Also, the tabs may advantageously project in directions toward the axis and in longitudinal direction of lead reception in the slots; and the tabs may be integrally connected with body longitudinally elongated walls. Also, the tabs may have tips projecting into the slots or channels, to be engaged by the leads.

Yet another object is the provision of a recess defined by the body supporting end portion, the recess receiving the electrical component, such as the lead frame of the LED, to seat the latter, the slot means intersecting the recess, the tab means longitudinally spaced from that recess. The seated component has leads, as referred to, which extend in the slots and into frictional engagement with the retention means, i.e., typically in the form of deflected tabs.

Yet another object is the mounting of the LED so that a central lead thereof passes through a central passage in the tubular body.

A further object is the provision of channels, as described, located in spaced, angular relation, i.e., at 0°, 90°, 180°, and 270° angularity about the stand-off body central axis.

A further object is to provide a method for spacing the base of an LED having leads from a circuit board, that include the steps:

a) providing a stand-off body having a main axis and being a generally tubular, b) providing the body with first structure at one end thereof defining openings for passing LED leads to extend generally parallel to the axis, and to the board, c) supporting the LED base at an end of the body in spaced relation to the board, and extending the leads through the openings, d) and providing means associated with the structure frictionally engaging at least one of the leads proximate one of the openings, thereby to frictionally retain the LED in the mounted position, and to pre-position the leads for reception by the circuit board.

These and other objects and advantages of the invention, as well as the details of an illustrative embodiment, will be more fully understood from the following specification and drawings, in which:

DRAWING DESCRIPTION

FIG. 5 is an enlarged fragmentary elevation showing the configuration of a tab as employed in FIG. 1;

FIG. 6 is an enlarged fragmentary section taken normal to the plane of FIG. 3 and showing a lead passing through a channel; and FIG. 7 is a view like FIG. 1 but showing two leads extending through the stand-off device.

DETAILED DESCRIPTION

Figure 1:
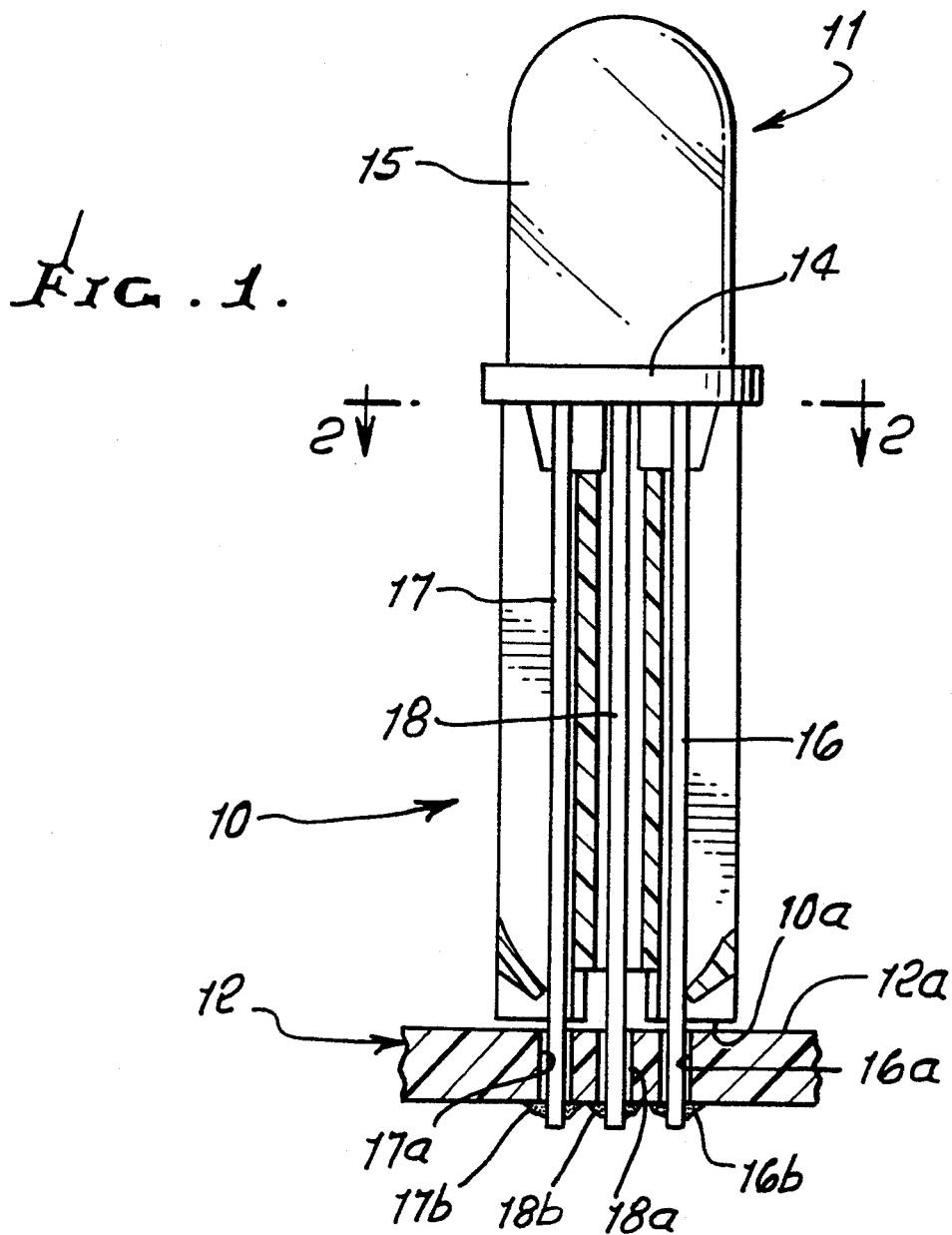
FIG. 1 is a vertical elevation, partly in section, showing a stand-off device incorporating the invention, and with three leads projecting from an LED, and to a circuit board retained by the device.

In FIG. 1, an upright, stand-off device 10 mounts an electrical component 11, in stand-off (spaced) relation, to a horizontally extending circuit board 12. The device or component may comprise an LED, as shown, having a base 14, light passing lens 15, and multiple (three) leads 16–18. The latter extend downwardly from the base 14 to the circuit board 12. Typically, the leads extend through board openings 16a–18a to connect, as via wave soldering at 16b–18b, to electrical circuitry. Accordingly, the leads retain the LED 11, and stand-off device 10, in mounted position, as shown, the lower end 10a of device 10 engaging the board top surface 12a.

As referred to, the device 10 comprises:

a) a longitudinally vertically elongated body having a supporting end portion to support the component remotely from the board, the body having slot means extending from the end portion to receive the lead means, such as leads 16–18;

b) and deflectable retention means carried by the body in proximity to the slot means, to be engaged and deflected by the lead means, whereby the retention means frictionally retain the lead means in position in the slot means prior to attachment of the lead means to the circuit board.

Figure 2:
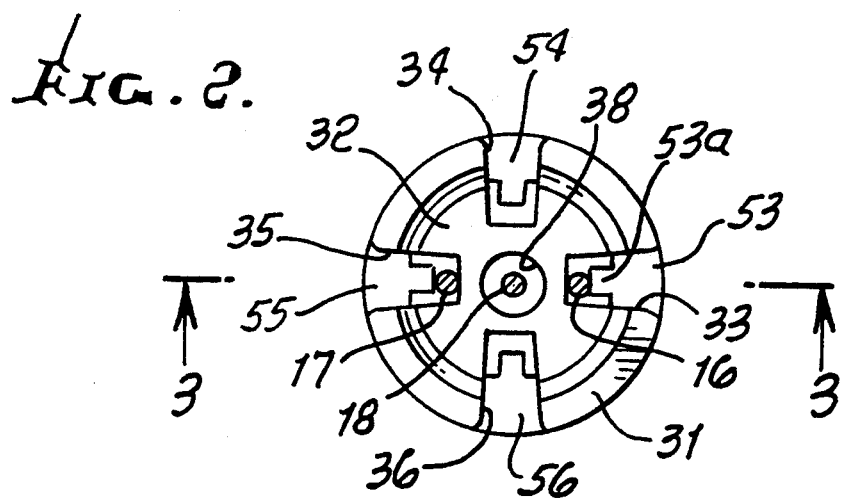
FIG. 2 is an enlarged top plan view taken on lines 2—2 of FIG. 1.
Figure 3:
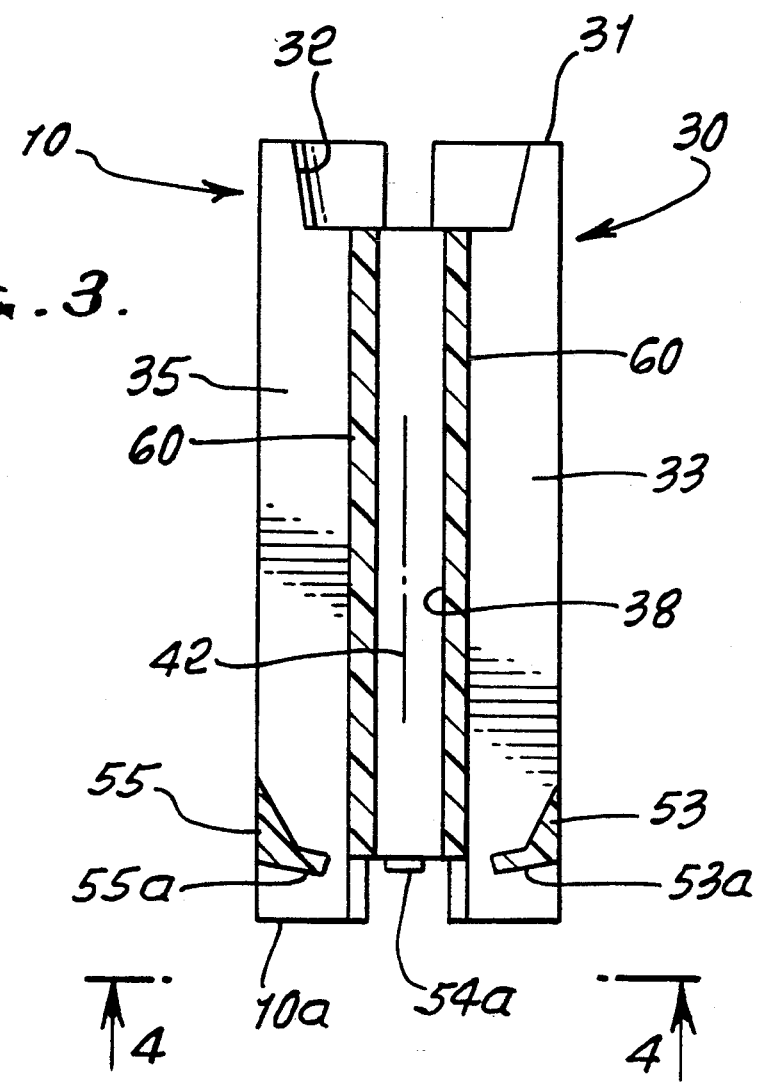
FIG. 3 is a section taken on lines 3—3 of FIG. 2.
Figure 4:
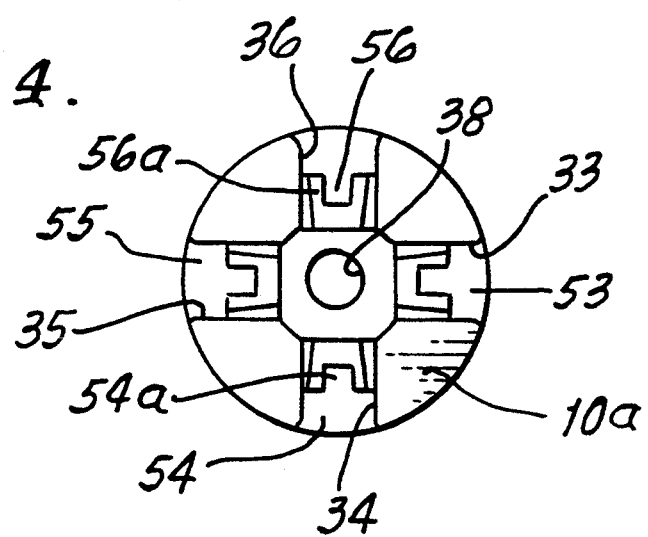
FIG. 4 is a bottom plan view taken on lines 4—4 of FIG. 3.

As shown, the device frame or body 30, typically consisting of insulation material, such as plastic, has an upper, flat surface 31, engaged by base 14, a recess 32, sunk in that surface (and into which a lead frame 70 may be received and seated at 71, as seen in FIG. 7). Slot means defined by the body takes the form, in the example, of four parallel channels 33–36 extending longitudinally and vertically, parallel to the body axis 42. The channels are located at angles 0°, 90°, 180°, and 270° about that axis, as seen in FIGS. 2 and 4. The body also has a central bore 38 or passage, at axis 42, parallel to 33–36. Such channels 33–36 and bore or passage 38 extend through the body, so as to receive leads from the LED; thus, up to four leads may extend through the body channels 33–36, and another central lead may extend through passage 38. See for example FIG. 1 showing leads 16 and 17 in opposite (0° and 180°) channels 33 and 35, and a central lead 18 in passage 38. Additional leads may extend in channels 34 and 36.

FIG. 7 shows only the two lead configuration, i.e., lead 16 in channel 33 and lead 17 in channel 35.

The lead retention means, useful for prepositioning the component and leads in and relative to the stand-off device, i.e, prior to lead connection to the circuit board, is shown in the form of four tabs 53–56 associated with channels 33–36, respectively. Note for example tapered tab 53 projecting in channel 33, and into position such that the tab reduced thickness end 53a projects into the path of lead 16 insertion endwise into channel 33, to interfere with the lead and to be deflected downwardly, as shown in FIG. 1. The tab two lateral edges 55b and 55c are molded integrally with channel walls, as at 35c and 35d, seen in FIG. 6.

The tab 55 may be V-shaped in vertical radial section, as shown in FIG. 5, to enhance its flexibility at 55a, yet provide sturdy edge support for the tab. The flexible retention tabs projects toward axis 42, angularly and downwardly toward the circuit board, to be deflected downwardly by the leads, as the leads are inserted. Four such tabs are provided, one in each channel, near the bottom thereof, to accurately position the leads frictionally against the body walls 60, at the interior of the channels, as the leads are inserted. Therefore, the leads are pre-positioned axially and also normal to the body axis, i.e., slightly deflected radially against surfaces 60 at equal radial distances from axis 42, to be passed accurately and precisely through the lead openings in the circuit board, enabling more rapid and accurate assembly of the LEDs to the board, via LED leads which are to hold the LEDs and stand-off devices to the board, as referred to.

The stand-off device can be made in sizes between 0.100 inch and 1.0 inch, for example.

As shown in FIGS. 1–7, the channels 33–36 open sidewardly away from the body axis 42.

I claim:

1. In a stand-off device to mount an electrical component, in stand-off relation to a horizontally extending circuit board, the component having elongated leads, the combination with said component comprising
   a) a longitudinally vertically elongated body having a supporting end portion to support said component remotely from the board, said body having slot means extending from said end portion in parallel relation and lengthwise of said body to receive said leads,
   b) and retention means comprising resiliently deflectable tab means carried by the body in proximity to said slot means to be engaged and deflected by the leads, whereby the retention means frictionally retains the leads in position in said slot means prior to attachment of the leads to the circuit board,
   c) said body having a central longitudinally elongated axis, said slot means including channels which extend longitudinally and are spaced laterally from said axis, said channels opening sidewardly away from said axis, and to the exterior, the body having fixed walls at the inner side of and adjacent said channels and facing away from said axis,
   d) said tab means comprising tabs projecting in said channels and toward said axis and into paths of longitudinal reception of the leads, the leads received in the channels and the tabs having terminal portions engaged by said leads and deflected by the leads away from said axis, the tabs urging said leads toward said fixed walls at the inner sides of the channels, whereby the leads are positioned adjacent said fixed walls which have longitudinal lengths substantially exceeding the longitudinal lengths of said tabs, said tabs projecting toward and urging the leads toward said fixed walls.

2. The combination of claim 1 wherein said slot means comprises one of the following:
   i) two parallel slots
   ii) three parallel slots
   iii) four parallel slots.

3. The combination of claim 1 wherein said tabs project in directions toward said axis and in the longitudinal direction of lead reception in the channels.

4. The combination of claim 1 wherein the channels have longitudinally elongated side walls with which said tabs are integrally connected, said fixed walls being free of said tabs.

5. The combination of claim 1 wherein said supporting end portion defines a recess into which said component is received and seated, said slot means intersecting said recess, said tab means longitudinally spaced from said recess.

6. The combination of claim 1 wherein said leads extend in deflected and frictional engagement with said tabs.

7. The combination of claim 1 wherein said component comprises an LED.

8. The combination of claim 1 wherein said slot means includes another slot that extends axially and centrally through said body.

9. The combination of claim including said circuit board to which said body is connected via said leads.

10. In stand-off apparatus for spacing an LED having leads from a circuit board, the combination with said LED comprising:
    a) a stand-off body having a main axis and being generally tubular,
    b) said body having first structure at one end thereof defining openings for passing LED leads to extend generally parallel to said axis, and to said board, said openings defining slot means,
    c) said body having second structure at the other end of the body for passing said LED leads, the LED having a body adapted to be supported by the stand-off body at one of said ends, and in spaced relation to the board,
    d) and positioning means comprising tab means associated with at least one of said structures for frictionally engaging said leads proximate said openings, thereby to frictionally retain the LED in supported position, e) said slot means including channels which extend longitudinally and are spaced laterally from said axis, the body having fixed walls at the inner side of and adjacent said channels and facing away from said axis, said channels opening sidewardly away form said axis, and to the exterior, f) said tab means comprising tabs projecting in said channels and toward said axis and into paths of longitudinal reception of the leads, the leads received in the channels and the tabs having terminal portions engaged by said leads and deflected by the leads away from said axis, the tabs urging said leads toward said fixed walls at the inner sides of the channels, whereby the leads are positioned adjacent said fixed walls which have longitudinal lengths substantially exceeding the longitudinal lengths of said tabs, said tabs projecting toward and urging the leads toward said fixed walls.

11. The combination of claim 10 wherein the LED has an end face engaging one of said structures.

12. The combination of claim 10 wherein the LED also has a medial lead passing through said tubular body.

13. The combination of claim 12 wherein the leads engaged by said postioning means project externally of said body.

14. The combination of claim 10 wherein said openings are located at opposite sides of said axis.

15. The combination of claim 14 wherein there is an additional lead received in an opening or openings located on a circle passing through said openings at opposite sides of said axis, and located at approximately equal distances from said openings at opposite sides of said axis.

16. The combination of claim 15 wherein said openings are located in angular relationship, at angles 0°, 90°, 180°, and 270° about said axis.

17. The combination of claim 16 wherein said positioning means is also located at angular positions about said axis, and at angular spacing corresponding to said opening spacings.

* * * * *